United States Patent
Lee et al.

(10) Patent No.: US 7,164,147 B2
(45) Date of Patent: Jan. 16, 2007

(54) SEMICONDUCTOR MEMORY DEVICE AND METHOD OF FABRICATING THE SAME

(75) Inventors: Jung-hyun Lee, Suwon-si (KR); Young-soo Park, Suwon-si (KR); Won-tae Lee, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/839,261

(22) Filed: May 6, 2004

(65) Prior Publication Data

US 2004/0234895 A1    Nov. 25, 2004

(30) Foreign Application Priority Data

May 23, 2003    (KR)    ........................ 10-2003-0032882

(51) Int. Cl.
*H01L 29/02*    (2006.01)

(52) U.S. Cl. .................. 257/4; 257/2; 257/3; 257/5; 257/E45.002; 257/E29.17; 438/102; 438/95; 365/163

(58) Field of Classification Search ............... 257/2, 257/4, 5; 438/102; 365/163
See application file for complete search history.

(56) References Cited

U.S. PATENT DOCUMENTS

| | | | |
|---|---|---|---|
| 6,072,716 A | 6/2000 | Jacobson et al. | |
| 6,294,452 B1 | 9/2001 | Doan et al. | 438/597 |
| 6,545,903 B1 | 4/2003 | Wu | |
| 6,912,146 B1* | 6/2005 | Gill et al. | 365/103 |
| 6,969,866 B1* | 11/2005 | Lowrey et al. | 257/3 |
| 7,078,273 B1* | 7/2006 | Matsuoka et al. | 438/128 |
| 2002/0058389 A1 | 5/2002 | Wicker | |
| 2002/0080647 A1* | 6/2002 | Chiang et al. | 365/175 |
| 2003/0003634 A1 | 1/2003 | Lowrey et al. | |
| 2003/0036232 A1 | 2/2003 | Dennison | |
| 2003/0047727 A1 | 3/2003 | Chiang | |
| 2004/0114317 A1* | 6/2004 | Chiang et al. | 361/683 |
| 2004/0233748 A1* | 11/2004 | Terao et al. | 365/202 |
| 2005/0122771 A1* | 6/2005 | Chen | 365/163 |
| 2006/0148135 A1* | 7/2006 | Matsuoka et al. | 438/127 |

FOREIGN PATENT DOCUMENTS

EP    1 376 604    1/2004

OTHER PUBLICATIONS

J. Maimon, Circuit Demonstration of Radiation Hardened Chalcogenide Non-Volatile Memory, Mar. 8-15, 2003, Aerospace Conference 2003 Proceedings 2003 IEEE, vol. 5, pp. 5_2373-5_2379.*

Hong Xiao, Introduction to Semiconductor Technology, 2001, Prentice Hall, First Edition, pp. 458-459.*

* cited by examiner

*Primary Examiner*—Jerome Jackson
*Assistant Examiner*—Paul Budd
(74) *Attorney, Agent, or Firm*—Lee & Morse, P.C.

(57) ABSTRACT

Provided are a semiconductor memory device and a method of fabricating the same. The semiconductor memory device includes a heating portion interposed between a transistor and a data storing portion, and a metal interconnection layer connected to the data storing portion. The data storing portion includes a chalcogenide material layer which undergoes a phase change due to heating of the heating portion to store data therein. The heating material layer is disposed under the chalcogenide material layer, and the top surface of the heating material layer is oxidized using a plasma oxidation process to increase a resistance value. Accordingly, the heat capacity necessary for the chalcogenide material layer can be transmitted using a small amount of current, and current used in the semiconductor memory device can be further reduced.

20 Claims, 7 Drawing Sheets

SEMICONDUCTOR MEMORY DEVICE AND METHOD OF FABRICATING THE SAME

BACKGROUND OF THE INVENTION

1. Field of the Invention

The present invention relates to a semiconductor memory device and a method of fabricating the same, and more particularly, to a semiconductor memory device including an improved heating unit for heating a storage/memory node made of a phase change material, and a method of fabricating the same.

2. Description of the Related Art

Ovonic unified memories (OUMs) use phase change materials as a data storing portion instead of capacitors in general dynamic random access memories (DRAMs). An OUM is a memory device which writes/reproduces information based on a principle that an electric resistance is changed according to a phase change of a chalcogenide material. Chalcogenide materials have been used in re-writable CDs, DVDs, and so on. When a chalcogenide material is transformed from a crystalline state into an amorphous state, the resistance of the chalcogenide material increases approximately 100 times. The chalcogenide material undergoes a phase change function of a heating temperature and a cooling time. Accordingly, when the chalcogenide material is in a crystalline state, it has low resistance such that it acts as a conductive material. However, when the chalcogenide material is in an amorphous state, it has high resistance such that it acts as a resistive material.

FIG. 1 is a schematic cross-sectional view of an OUM disclosed in U.S. Pat. No. 6,294,452.

Referring to FIG. 1, a lower electrode 102 is formed on a substrate 100 to have a tip portion 114. A chalcogenide material layer 128 and an upper electrode 122 are deposited over the tip portion 114 of the lower electrode 102. A conductive barrier layer 120 is interposed between the chalcogenide material layer 128 and the lower electrode 102 to prevent diffusion between the chalcogenide material layer 128 and the lower electrode 102. The upper electrode 122 is connected to a grid interconnection layer 126 to receive electric power from the outside. Herein, reference numerals 116 and 124 denote insulation layers.

The chalcogenide material is formed of a three-phase system, namely, germanium (Ge)-Tellurium (Te)-antimony (Sb). After a predetermined current is applied to the chalcogenide material, the chalcogenide material is transformed to an amorphous state according to a heat capacity applied thereto, and then, the resistance of the chalcogenide material is changed according to a cooling time. That is to say, when atoms of the chalcogenide material are slowly cooled in an amorphous state, they become crystalline and act as a conductive material. However, when the atoms are fast cooled, they become amorphous and exhibit high resistance. Such a resistance change can be expressed in a binary code and functions as a memory factor.

Therefore, a binary code "1" or "0" can be written in a selected cell of the OUM through the phase change. Further, the written binary code "1" or "0" can be read by reading the resistance of the programmable region.

The OUM is advantageous in that abrasion does not occur even though it is read so many times, a very small amount of voltage is necessary, and compatibility with existing design environments is high. Furthermore, since the OUM can be used about one thousand million times, it can easily to substitute the existing high capacity storages.

However, to transform the chalcogenide material layer 128 into an amorphous state in the OUM structure as above, the chalcogenide material layer 128 should be heated to above 600° C. Therefore, a large amount of current should be applied to the lower electrode 102.

SUMMARY OF THE INVENTION

The present invention provides a semiconductor memory device which can transform a chalcogenide material by disposing a heating unit under a chalcogenide material layer and heating the heating unit using a small current, and a method of fabricating the same.

According to a feature of an embodiment of the present invention, there is provided a semiconductor memory device having a transistor and a data storing portion including a heating portion interposed between the transistor and the data storing portion and a metal interconnection layer connected to the data storing portion, wherein the data storing portion includes a chalcogenide material layer, which undergoes a phase change due to a heating of the heating portion, for storing data therein. In the memory device, the chalcogenide material layer may be made of a three-phase system Te—Ge—Sb.

In the memory device, the heating portion may include a via hole that exposes a portion of the transistor, a spacer formed on inner walls of the via hole, and a heating material layer in the via hole within the spacer. The spacer may have a lower portion that is wider than an upper portion thereof. The heating material layer may be made of TiAlN.

In an embodiment of the memory device, the memory device may further include a conductive plug for connecting the heating portion and the transistor. The conductive plug may be made of polysilicon or tungsten. Preferably, the conductive plug is made of tungsten having low resistance. In this embodiment, the heating portion may include a via hole that exposes the conductive plug, a spacer formed on inner walls of the via hole, and a heating material layer in the via hole within the spacer. The heating material layer may be made of TiAlN.

In the memory device, a top surface of the heating portion may be oxidized.

In an embodiment of the present invention, the memory device may further include a TiAlN film interposed between the data storing portion and the metal interconnection layer, wherein a top surface of the TiAlN film is oxidized.

In the memory device, the metal interconnection layer may be made of TiAlN or tungsten.

According to another feature of an embodiment of the present invention, there is provided a method of fabricating a semiconductor memory device including (a) forming a transistor on a substrate, (b) forming a first interlayer insulating layer on the substrate to cover the transistor, (c) forming a contact hole through the first interlayer insulating layer to expose a predetermined area of the transistor, (d) forming a conductive plug within the contact hole, (e) forming a second interlayer insulating layer over the first interlayer insulating layer, (f) forming a heating portion in the second interlayer insulating layer, (g) forming a chalcogenide material layer on the heating portion, and (h) forming a metal interconnection layer on the chalcogenide material layer.

In the method, forming the heating portion in the second interlayer insulating layer may include forming a via hole through the second interlayer insulating layer to expose the conductive plug, forming an insulation film on the second interlayer insulating layer to cover inner walls of the via hole, forming a spacer within the via hole by etching the insulation film until the second interlayer insulating layer is exposed, and forming a heating material layer inside the spacer.

In the method, forming the heating material layer may include forming a TiAlN film on the second interlayer insulating layer to fill the spacer and planarizing the TiAlN film to expose the second interlayer insulating layer. The TiAlN film may be formed using an atomic layer deposition (ALD) process. The method may further include oxidizing a top surface of the planarized TiAlN film and oxidizing the top surface of the planarized TiAlN film may be performed using a plasma oxidization process.

In the method, forming the metal interconnection layer on the chalcogenide material layer may include forming a third interlayer insulating layer on the second interlayer insulating layer to cover the chalcogenide material layer, forming a via hole through the third interlayer insulating layer to expose the chalcogenide material layer, and forming a metal interconnection layer on the third interlayer insulating layer to fill the via hole.

Alternately, forming the metal interconnection layer on the chalcogenide material layer may include forming a third interlayer insulating layer on the second interlayer insulating layer to cover the chalcogenide material layer, forming a via hole through the third interlayer insulating layer to expose the chalcogenide material, depositing a TiAlN film on the third interlayer insulating layer to cover the exposed chalcogenide material layer, oxidizing a top surface of the TiAlN film, and forming a metal interconnection layer on the oxidized TiAlN film to fill the via hole. Oxidizing the top surface of the TiAlN film may be performed using a plasma oxidization process.

BRIEF DESCRIPTION OF THE DRAWINGS

The above and other features and advantages of the present invention will become more apparent to those of ordinary skill in the art by describing in detail preferred embodiments thereof with reference to the attached drawings in which.

EXPLANATION OF REFERENCE NUMERALS DESIGNATING THE MAJOR ELEMENTS OF THE DRAWINGS

Figure 1:
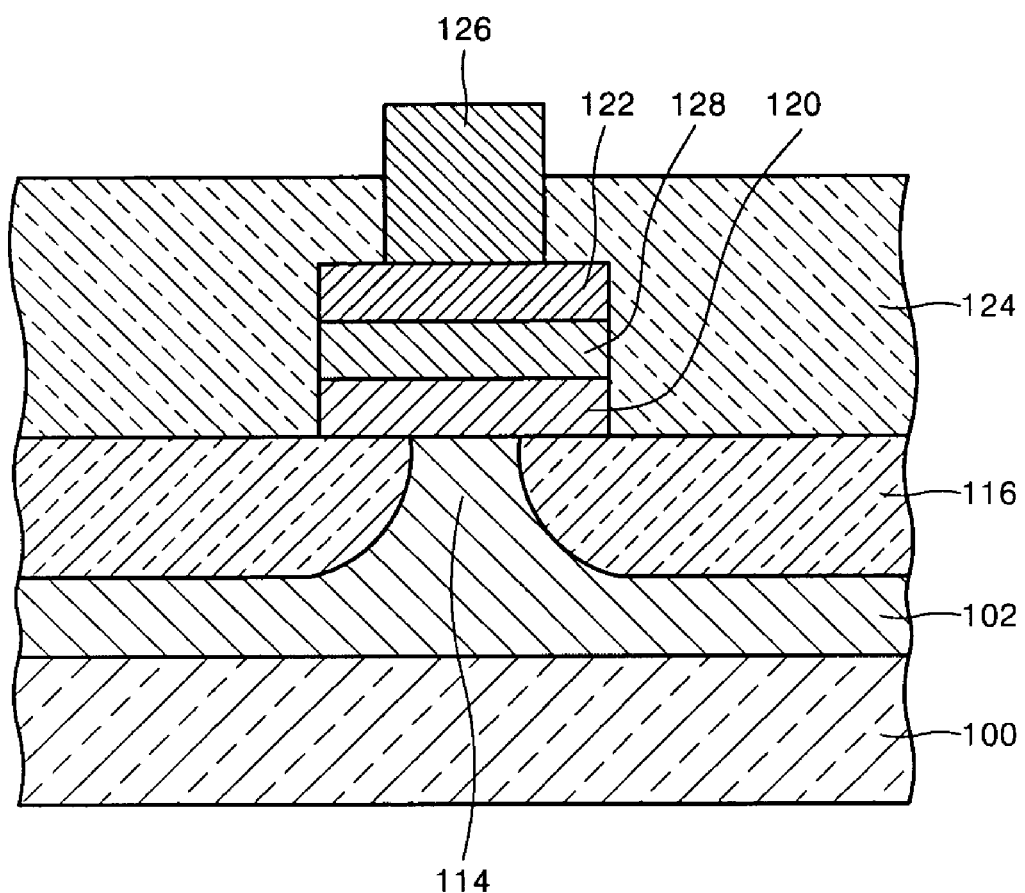
FIG. 1 is a schematic cross-sectional view of an ovonic unified memory disclosed in U.S. Pat. No. 6,294,452.

10: Semiconductor substrate
11: Source region
12: Drain region
20: Transistor
21: Gate insulation film
22: Gate electrode
23: First inter-layer insulating layer
24: Conductive plug
30: Heating portion
31: Etching barrier layer
32: Second inter-layer insulating layer
34: Spacer
36: Heating material layer
38: Oxide film
40: Chalcogenide material layer
42: Third inter-layer insulating layer
50: Metal interconnection layer

DETAILED DESCRIPTION OF THE INVENTION

Korean Patent Application No. 2003-32882, filed on May 23, 2003, and entitled: "Semiconductor Memory Device and Method of Fabricating the Same," is incorporated by reference herein in its entirety.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of layers and regions are exaggerated for clarity of illustration. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
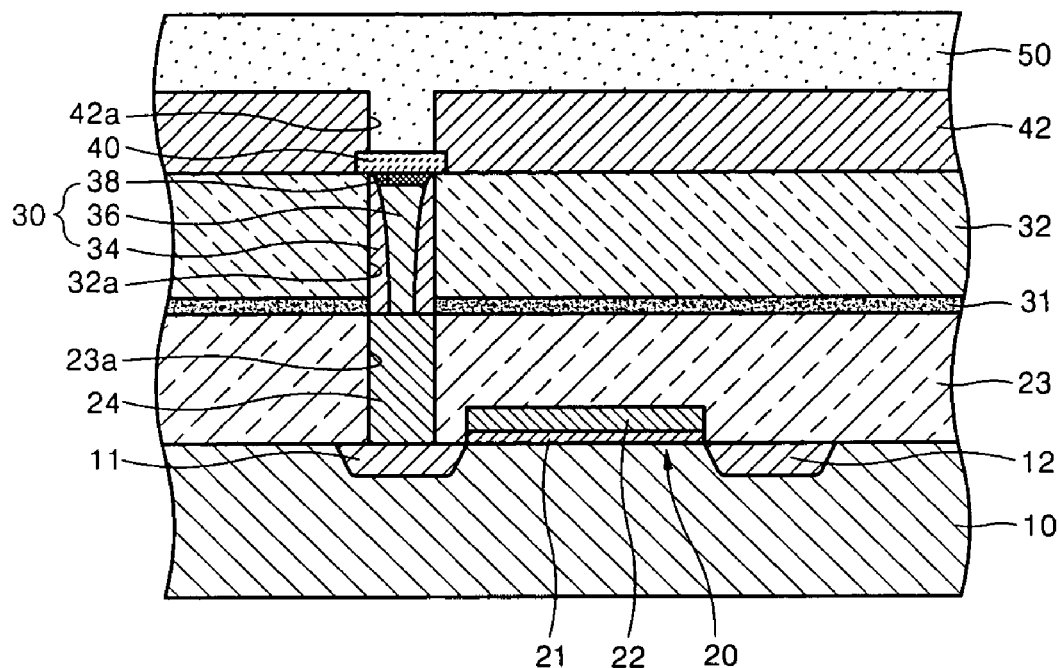
FIG. 2 is a cross-sectional view of a semiconductor memory device according to a preferred embodiment of the present invention.

FIG. 2 illustrates a cross-sectional view of a semiconductor memory device according to a first embodiment of the present invention.

Referring to FIG. 2, the semiconductor memory device includes a switching transistor 20, a data storing portion, which includes a chalcogenide material layer 40, and a heating portion 30, which heats the data storing portion. The transistor 20 includes a source region 11 and a drain region 12, which are n-type (n$^+$) layers formed on a p-type silicon substrate 10 to be spaced apart from each other. A gate insulation film 21 and a gate electrode 22 are formed on the substrate 10 between the source region 11 and the drain region 12.

The data storing portion is formed of the chalcogenide material layer 40 and a metal interconnection layer 50, which transmits an external signal and is formed on the chalcogenide material layer 40. The chalcogenide material layer 40 is made of a three-phase system Te—Ge—Sb.

The heating portion 30, which is a characteristic of the present invention, is formed under the chalcogenide material layer 40. The heating portion 30 is connected to the transistor 20 through a conductive plug 24. The conductive plug 24 is formed within a contact hole 23a formed through a first interlayer insulating layer 23, which is formed on the substrate 10 to cover the transistor 20. Since the conductive plug 24 receives current through the source region 11 and transmits the current to the heating portion 30, the conductive plug 24 is preferably formed of tungsten having low resistance.

The heating portion 30 is formed within a first via hole 32a, which is formed through a second interlayer insulating layer 32 deposited over the first interlayer insulating layer 23. A spacer 34 is formed on inner walls of the first via hole 32a. Preferably, the spacer 34 has a lower portion that is wider than an upper portion thereof. A heating material layer 36, e.g., made of titanium aluminium nitride (TiAlN), is formed within the spacer 34 within the first via hole 32a. It is preferable that a top surface of the TiAlN layer 36 is oxidized using a plasma oxidation process to form a predetermined oxide film 38. Accordingly, the upper portion of the TiAlN layer 36 has high resistance and a lower portion of the TiAlN layer 36 has high conductivity.

The metal interconnection layer 50 communicates with the chalcogenide material layer 40 through a second via hole 42a formed through a third interlayer insulating layer 42 formed on the second interlayer insulating layer 32.

Reference numeral 31 denotes a SiN film, which can act as an etching barrier layer when the first via hole 32a is formed by wet etching the second interlayer insulating layer 32 made of $SiO_2$.

Figure 3:
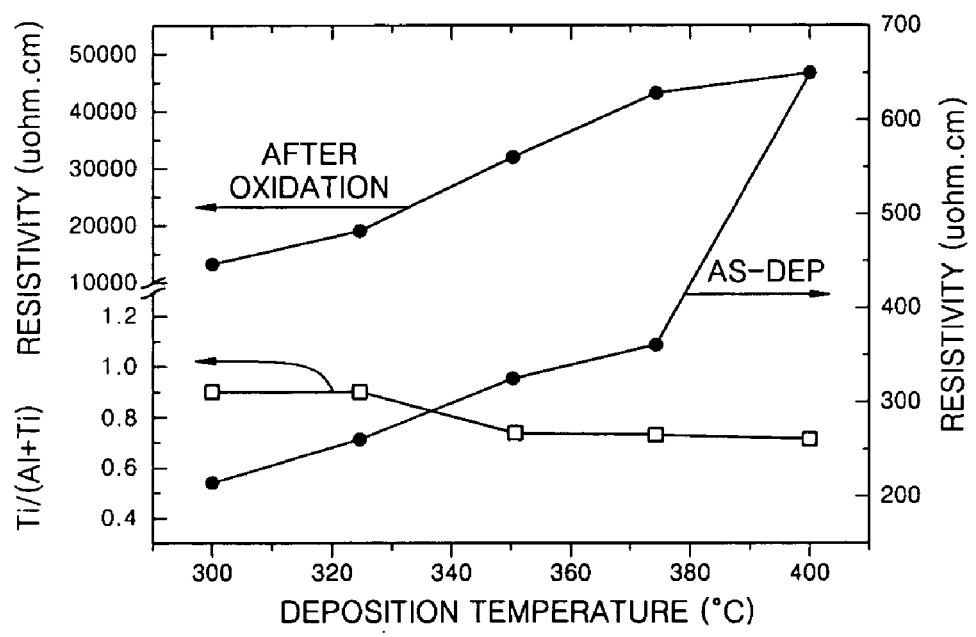
FIG. 3 is a graph illustrating a resistance of TiAlN according to temperature and oxidation when a TiAlN layer is formed using an atomic layer deposition process.

FIG. 3 is a graph illustrating a resistivity of TiAlN according to temperature and oxidation when a TiAlN layer is formed using an atomic layer deposition (ALD) process.

Referring to FIG. 3, when $TiCl_4$, which is a precursor of Ti, and $Al(CH_3)_3$, which is a precursor of Al, react to each other, a reaction speed between the precursors varies according to a deposition temperature. Thus, a composition of TiAl varies as denoted by Ti RATIO in FIG. 3. Next, $NH_3$ is adsorbed and nitrided to form the TiAlN layer. Further, as a composition of the TiAlN layer is changed, a resistivity of the TiAlN layer is changed. Meanwhile, as a top surface of the TiAlN layer is oxidized using a plasma oxidation process, the resistivity of the TiAlN layer sharply increases approximately 100 times. In FIG. 3, the line AS-DEP represents the TiAlN prior to the oxidation process and the line AFTER OXIDATION represents the TiAlN after the oxidation process.

Operation of the memory cell as described above will be explained in detail with reference to the figures.

When a voltage is applied to the gate electrode 22 of the transistor 20, e.g., the transistor 20 is switched on, a current flows between the source region 11 and the drain region 12. Accordingly, the current flows in the chalcogenide material layer 40 through the conductive plug 24 and the heating material layer 36. Here, because a current density increases at the lower portion of the heating material layer 36, preheating can be easily achieved. Since a heating value is high at the upper portion of the heating material layer 36, the heating material layer 36 is able to transmit a large amount of heat to the chalcogenide material layer 40. Thus, the chalcogenide material layer 40 is transformed to an amorphous state or a crystalline state depending on the heating value of the heating material layer 36. More specifically, when the time taken to turn on the transistor 20 is relatively long, the chalcogenide material layer 40 is transformed to a crystalline state, and accordingly acts as a conductive material. In contrast, when the time taken to turn on the transistor is relatively short, the chalcogenide material layer 40 is transformed to an amorphous state, and accordingly acts as a resistive material.

Therefore, a memory cell of the transistor 20 and the metal interconnection layer 50 is selected using the phase change process to write data "1" or "0". Furthermore, the written data "1" or "0" can be read by reading the resistance of the chalcogenide material layer 40.

Figure 4:
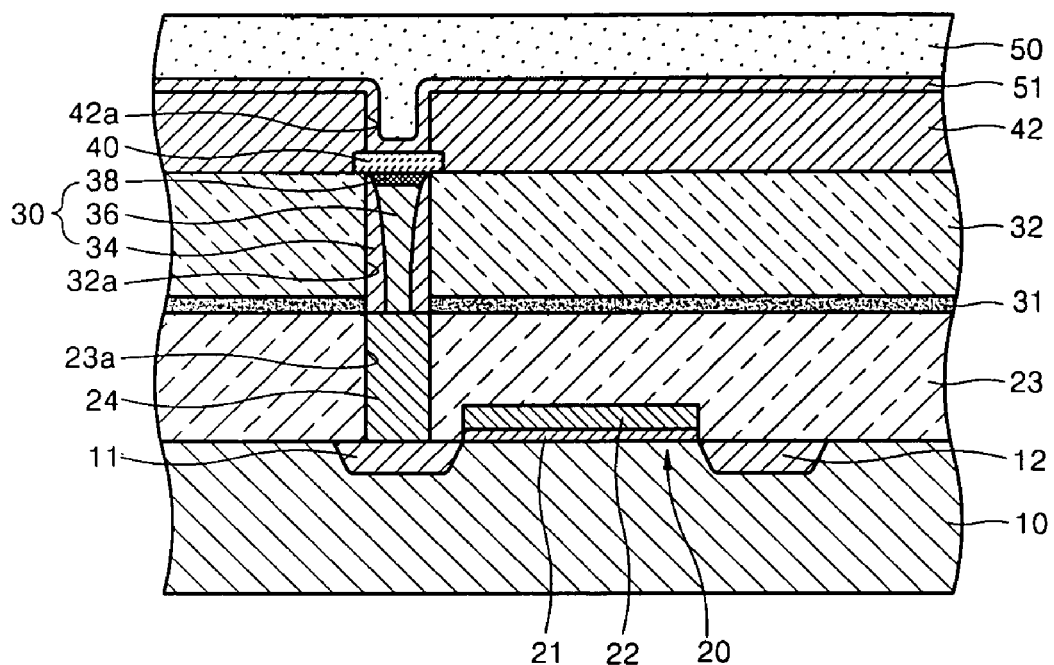
FIG. 4 is a cross-sectional view of a semiconductor device according to another preferred embodiment of the present invention, which is a modification of the semiconductor memory device in FIG. 2.

FIG. 4 illustrates a cross-sectional view of a semiconductor memory device according to a second embodiment of the present invention, which is a modification of the semiconductor memory device shown in FIG. 2. The same reference numerals in FIG. 4 designate the same elements as in FIG. 2 and a detailed explanation thereof will not be repeated.

Referring to FIG. 4, a TiAlN film 51 is formed on the third interlayer insulating layer 42 to cover the second via hole 42a. The top surface of the TiAlN film 51 is then oxidized using a plasma oxidation process, so that transmission of electric heat from the chalcogenide material layer 40 to the metal interconnection layer 50 is prevented.

FIGS. 5A through 5I illustrate cross-sectional views of stages in a method of fabricating the semiconductor memory device shown in FIG. 4.

Figure 5A:
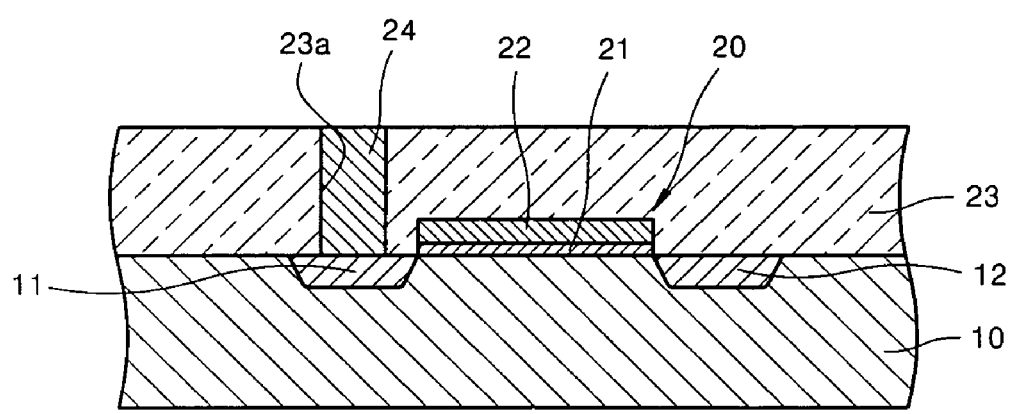
FIGS. 5A through 5I are cross-sectional views illustrating a method of fabricating the semiconductor memory device in FIG. 4.

First, as shown in FIG. 5A, the transistor 20 is formed on the semiconductor substrate 10 using a well-known method in the semiconductor field. Next, the first interlayer insulating layer 23 is formed on the semiconductor substrate 10. The first interlayer insulating layer 23 is selectively etched to form the contact hole 23a, which exposes the source region 11 of the transistor 20. The conductive plug 24 is filled in the contact hole 23a to be connected to the source region 11. Here, the conductive plug 24 may be made of polysilicon or tungsten. Preferably, the conductive plug 24 is made of tungsten having low resistance.

Figure 5B:
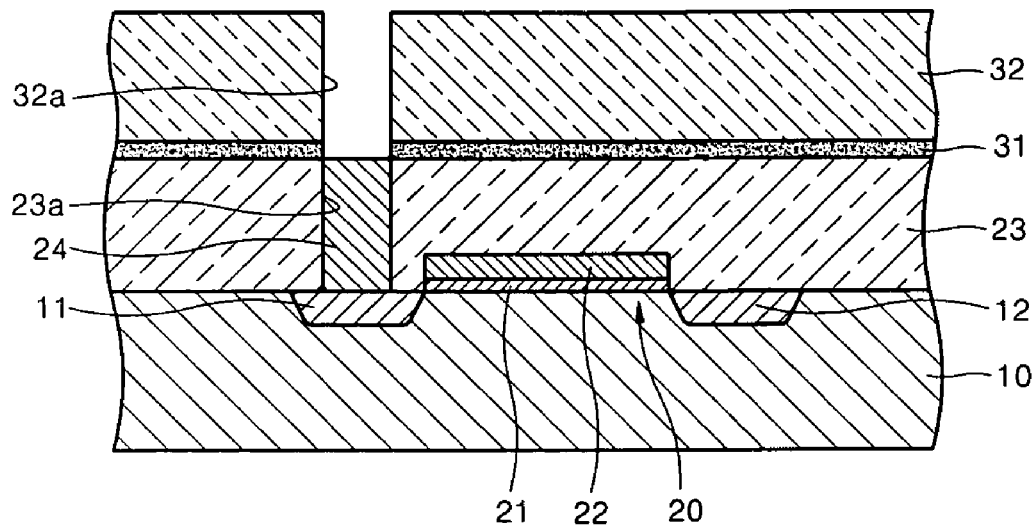

Next, as shown in FIG. 5B, the insulation film 31 made of SiN, which initially covers the conductive plug 24, and the second interlayer insulating layer 32 are successively deposited on the first interlayer insulating layer 23 and the conductive plug 24. The insulation layer 31 and the second interlayer 32 are selectively etched to form the first via hole 32a, which exposes the conductive plug 24.

Figure 5C:
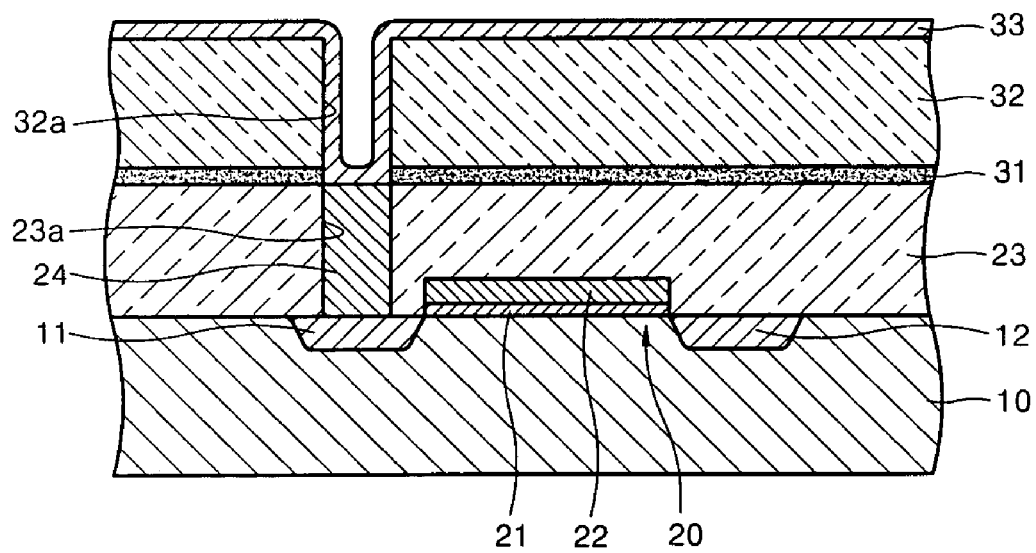

Next, as shown in FIG. 5C, an insulation film 33, e.g., made of SiN, is formed on the second interlayer insulating layer 32 to cover the inner walls of the first via hole 32a.

Figure 5D:
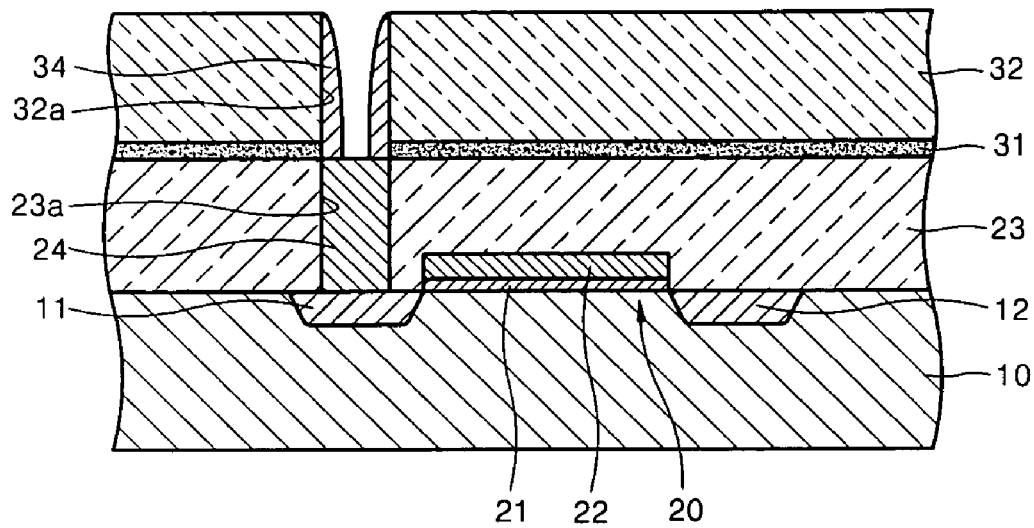

Next, as shown in FIG. 5D, the insulation film 33 is ion etched until the second interlayer insulating layer 32 is exposed. The insulation film 33 formed on the inner walls of the first via hole 32a is etched using the ion etching process such that the spacer 34 having the wider lower portion and narrower upper portion is formed.

Figure 5E:
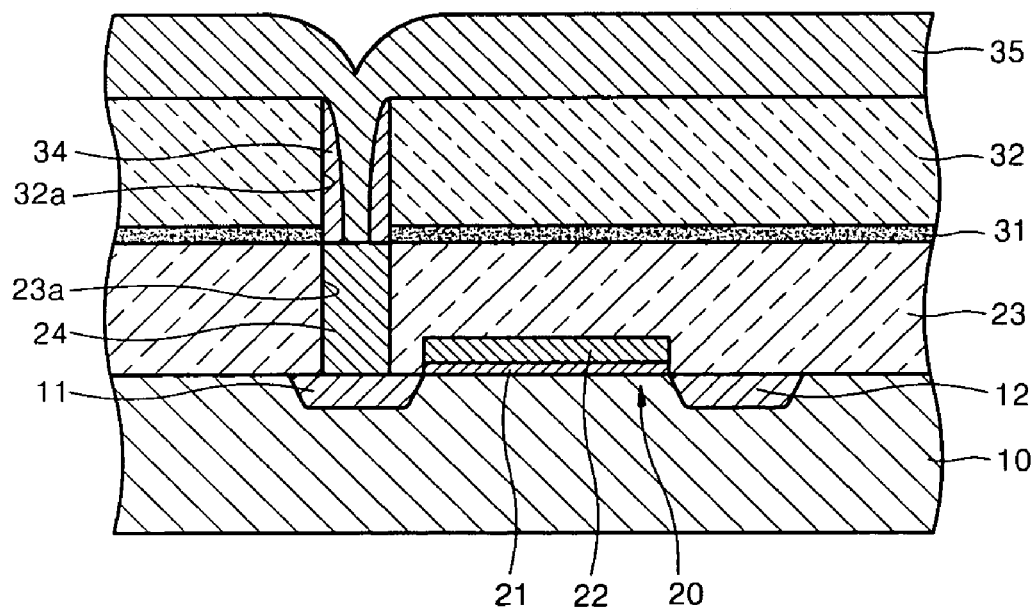

Next, as shown in FIG. 5E, a TiAlN film 35 is deposited on the second interlayer insulating layer 32 to fill the first via hole 32a within the spacer 34 using an ALD process. Here, the TiAlN film 35 is deposited using the ALD so that the composition of TiAlN can be controlled by adjusting a deposition temperature, and accordingly the resistivity can be controlled as shown in FIG. 3.

Figure 5F:
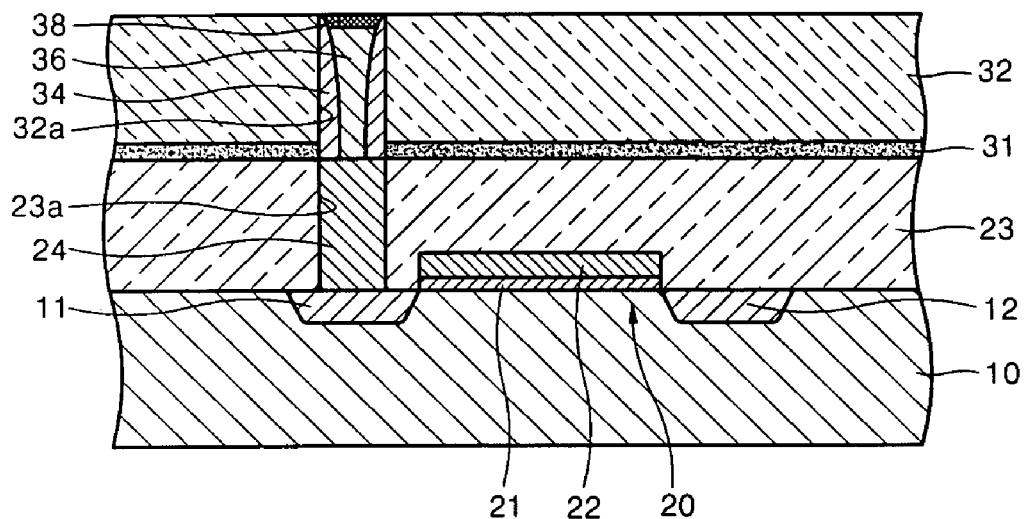

Next, as shown in FIG. 5F, the TiAlN film 35 is planarized using a chemical mechanical polishing (CMP) to expose the second interlayer insulating layer 32 and thus form the heating material layer 36. The top surface of the heating material layer 36 is then oxidized using a plasma oxidation process to form the oxide film 38. The resistance of the heating material layer 36 on which the oxide film 38 is formed drastically increases as shown in FIG. 3. As a consequence, although the same current flows, a heating value increases.

Figure 5G:
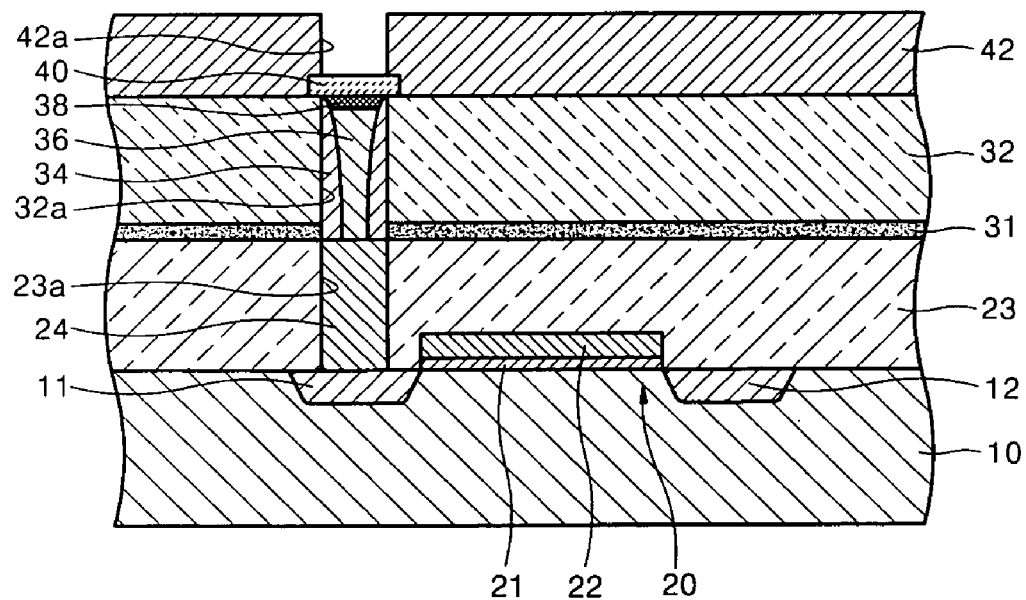

Next, as shown in FIG. 5G, the three-phase system Te—Ge—Sb is sputtered onto the second interlayer insulating layer 32 and the heating material layer 36 to form a chalcogenide thin film. Then, the chalcogenide thin film is patterned to form the chalcogenide material layer 40 on the heating material layer 36. Subsequently, a third interlayer insulating layer 42 is formed on the second interlayer insulating layer 32 and the chalcogenide material layer 40 to cover the chalcogenide material layer 40. Then, to expose the chalcogenide material layer 40, the second via hole 42a is formed through the third interlayer insulating layer 42.

Figure 5H:
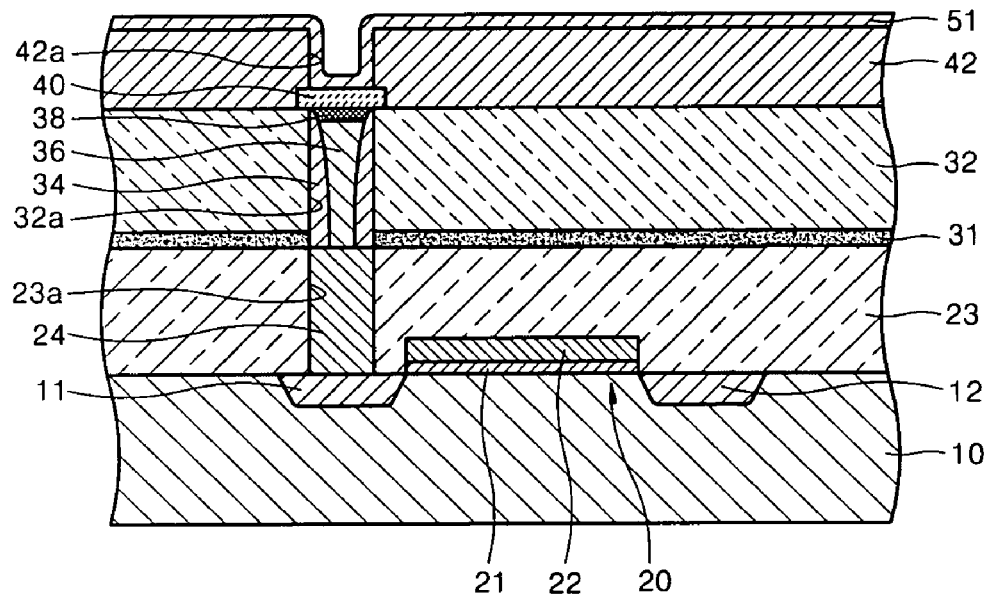

Next, as shown in FIG. 5H, the TiAlN film 51 is deposited on the third interlayer insulating layer 42 using the ALD to cover the second via hole 42a. Then, the top surface of the TiAlN film 51 is oxidized using a plasma oxidation process. The oxidized TiAlN film 51 prevents electric heat from being transmitted from the chalcogenide material 40 to the metal interconnection layer 50, which will be subsequently formed.

Figure 5I:
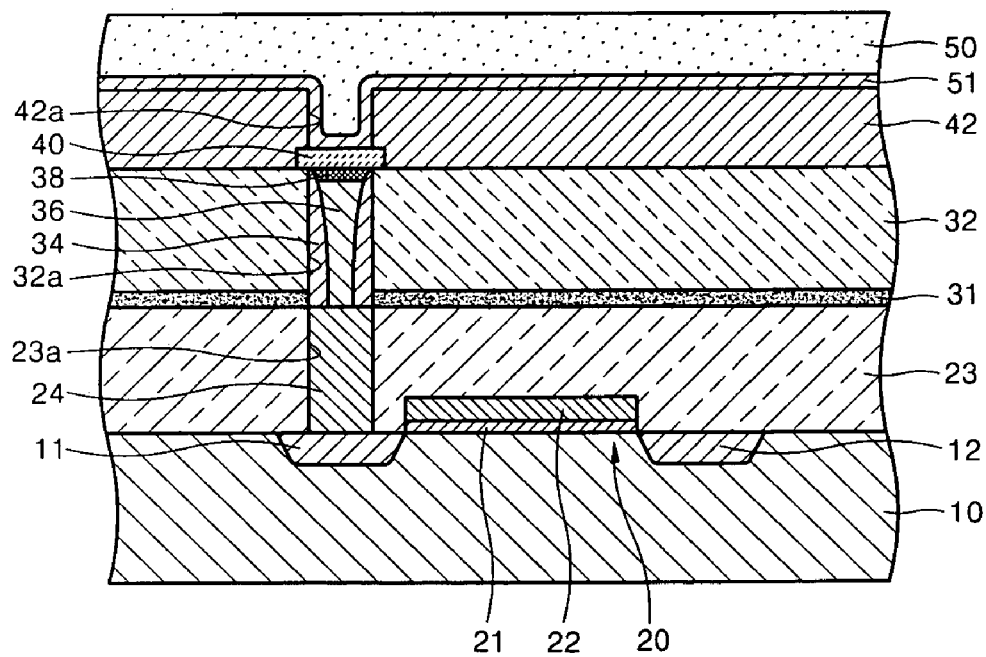

Next, as shown in FIG. 5I, the metal interconnection layer 50, which is made of either TiAlN or tungsten, is formed on the TiAlN film 51. The metal interconnection layer 50 is formed in a shape of a grid to transmit an external signal to the chalcogenide material layer 40, which is part of the data storing portion of the selected memory cell.

As described above, in the semiconductor memory device according to the embodiments of the present invention, a heating material layer is positioned under a chalcogenide material layer, and a top surface of the heating material layer is oxidized using a plasma oxidation process to increase a resistivity thereof. Accordingly, the heat capacity necessary for the chalcogenide material layer can be transmitted using a small amount of current. Thus, the current used in the semiconductor memory device can be reduced.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor memory device including a transistor and a data storing portion, comprising:
   a heating portion interposed between the transistor and the data storing portion, a top surface of the heating portion being oxidized; and
   a metal interconnection layer connected to the data storing portion,
   wherein the data storing portion includes a chalcogenide material layer, which undergoes a phase change due to a heating of the heating portion, for storing data therein.

2. The semiconductor memory device as claimed in claim 1, wherein the chalcogenide material layer is made of a three-phase system Te—Ge—Sb.

3. The semiconductor memory device as claimed in claim 1, wherein the heating portion comprises:
   a via hole that exposes a portion of the transistor;
   a spacer formed on inner walls of the via hole; and
   a heating material layer in the via hole within the spacer.

4. The semiconductor memory device as claimed in claim 3, wherein the spacer has a lower portion that is wider than an upper portion thereof.

5. The semiconductor memory device as claimed in claim 3, wherein the heating material layer is made of TiAlN.

6. The semiconductor memory device as claimed in claim 1, further comprising a conductive plug for connecting the heating portion and the transistor.

7. The semiconductor memory device as claimed in claim 6, wherein the conductive plug is made of polysilicon or tungsten.

8. The semiconductor memory device as claimed in claim 6, wherein the conductive plug is made of tungsten having low resistance.

9. The semiconductor memory device as claimed in claim 6, wherein the heating portion comprises:
   a via hole that exposes the conductive plug;
   a spacer formed on inner walls of the via hole; and
   a heating material layer in the via hole within the spacer.

10. The semiconductor memory device as claimed in claim 9, wherein the heating material layer is made of TiAlN.

11. The semiconductor memory device as claimed in claim 1, further comprising a TiAlN film interposed between the data storing portion and the metal interconnection layer, wherein a top surface of the TiAlN film is oxidized.

12. The semiconductor memory device as claimed in claim 1, wherein the metal interconnection layer is made of TiAlN or tungsten.

13. A semiconductor memory device including a transistor and a data storing portion, comprising:
   a heating portion interposed between the transistor and the data storing portion;
   a metal interconnection layer connected to the data storing portion; and
   a TiAlN film interposed between the data storing portion and the metal interconnection layer, wherein a top surface of the TiAlN film is oxidized,
   wherein the data storing portion includes a chalcogenide material layer, which undergoes a phase change due to a heating of the heating portion, for storing data therein.

14. The semiconductor memory device as claimed in claim 13, wherein the chalcogenide material layer is made of a three-phase system Te—Ge—Sb.

15. The semiconductor memory device as claimed in claim 13, wherein the heating portion comprises:
   a via hole that exposes a portion of the transistor;
   a spacer formed on inner walls of the via hole; and
   a heating material layer in the via hole within the spacer.

16. The semiconductor memory device as claimed in claim 15, wherein the spacer has a lower portion that is wider than an upper portion thereof.

17. The semiconductor memory device as claimed in claim 15, wherein the heating material layer is made of TiAlN.

18. The semiconductor memory device as claimed in claim 13, further comprising a conductive plug for connecting the heating portion and the transistor.

19. The semiconductor memory device as claimed in claim 18, wherein the heating portion comprises:
   a via hole that exposes the conductive plug;
   a spacer formed on inner walls of the via hole; and
   a heating material layer in the via hole within the spacer.

20. The semiconductor memory device as claimed in claim 19, wherein the heating material layer is made of TiAlN.

* * * * *